(12) United States Patent
Tian (10) Patent No.: US 10,690,786 B2
(45) Date of Patent: Jun. 23, 2020

(54) X-RAY DETECTOR AND MANUFACTURING METHOD THEREOF (71) Applicant: BOE TECHNOLOGY GROUP CO., LTD., Beijing (CN)

(72) Inventor: Hui Tian, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/763,551

(22) PCT Filed: Aug. 8, 2017

(86) PCT No.: PCT/CN2017/096440
§ 371 (c)(1),
(2) Date: Mar. 27, 2018

(87) PCT Pub. No.: WO2018/126679
PCT Pub. Date: Jul. 12, 2018

(65) Prior Publication Data
US 2019/0049597 A1 Feb. 14, 2019

(30) Foreign Application Priority Data
Jan. 4, 2017 (CN) .......................... 2017 1 0005101

(51) Int. Cl.
G01T 1/20 (2006.01)
G01T 1/208 (2006.01)
(Continued)

(52) U.S. Cl.
CPC ............ *G01T 1/2006* (2013.01); *G01T 1/208* (2013.01); *H01L 27/14612* (2013.01);
(Continued)

(58) Field of Classification Search
CPC . G01T 1/2006; G01T 1/208; H01L 27/14658; H01L 27/14663;
(Continued)

(56) References Cited

U.S. PATENT DOCUMENTS 6,403,965 B1 * 6/2002 Ikeda ................ H01L 27/14659
250/363.02
9,735,195 B2 8/2017 Shu et al.
(Continued)

FOREIGN PATENT DOCUMENTS

CN 102881701 A 1/2013
CN 203085544 U 7/2013
(Continued)

OTHER PUBLICATIONS

First Office Action for Chinese Patent Application No. 201710005101.1 dated Dec. 20, 2018.
(Continued)

Primary Examiner — Thanhha S Pham
(74) Attorney, Agent, or Firm — Calfee, Halter & Griswold LLP (57) ABSTRACT A X-ray detector includes: a base substrate; a plurality of detection modules disposed on the base substrate, wherein the detection module includes a thin film transistor disposed on the base substrate, an insulating layer with a via hole disposed on the thin film transistor and a photosensitive structure disposed on the insulating layer, a first electrode of the thin film transistor is electrically connected to the photosensitive structure through the via hole on the insulating layer, and the first electrode is a source or a drain electrode of the thin film transistor; and a scintillation layer disposed on the detection module. In the present disclosure, by disposing the photosensitive structure and the TFT in
(Continued)

different layers, the photosensitive area of the photosensitive structure is enlarged, and it will not be affected by the TFT.

10 Claims, 5 Drawing Sheets

(51) Int. Cl.
*H01L 27/146* (2006.01)
*H01L 31/0288* (2006.01)
*H01L 31/0216* (2014.01)
*H01L 31/0224* (2006.01)
*H01L 31/20* (2006.01)
*H01L 31/0376* (2006.01)

(52) U.S. Cl.
CPC .. *H01L 27/14636* (2013.01); *H01L 27/14658* (2013.01); *H01L 27/14663* (2013.01); *H01L 27/14689* (2013.01); *H01L 27/14692* (2013.01); *H01L 31/0288* (2013.01); *H01L 31/02161* (2013.01); *H01L 31/022408* (2013.01); *H01L 31/03762* (2013.01); *H01L 31/202* (2013.01)

(58) Field of Classification Search
CPC ....... H01L 31/022408; H01L 27/14692; H01L 27/14689; H01L 31/02161; H01L 31/0288; H01L 31/0762; H01L 31/202; H01L 27/14636; H01L 27/14612
See application file for complete search history.

(56) References Cited

U.S. PATENT DOCUMENTS

| | | | |
|---|---|---|---|
| 2014/0155181 A1 | 6/2014 | Zhang | |
| 2015/0287760 A1* | 10/2015 | Karim | H01L 27/14663 257/53 |
| 2016/0380022 A1* | 12/2016 | Shu | H01L 27/14612 378/98.8 |

FOREIGN PATENT DOCUMENTS

| | | |
|---|---|---|
| CN | 103681701 A | 3/2014 |
| CN | 104637970 A | 5/2015 |
| CN | 104716152 A | 6/2015 |
| CN | 104823280 A | 8/2015 |
| CN | 104979367 A | 10/2015 |
| CN | 105514029 A | 4/2016 |
| CN | 106653789 A | 5/2017 |

OTHER PUBLICATIONS

International Search Report for corresponding PCT application No. PCT/CN2017/096440 dated Nov. 17, 2017.

* cited by examiner

X-RAY DETECTOR AND MANUFACTURING METHOD THEREOF

CROSS REFERENCE TO RELATED APPLICATIONS

The present application is based on International Application No. PCT/CN2017/096440, filed on Aug. 8, 2017, which is based upon and claims the priority of the Chinese Patent Application No. 201710005101.1 filed on Jan. 4, 2017 and entitled "X-Ray Detector and Manufacturing Method Thereof", the entire contents of which are hereby incorporated by reference.

TECHNICAL FIELD

The present disclosure relates to the field of detection technology, and in particular, to an X-ray detector and a method for manufacturing the same.

BACKGROUND

An X-ray detector is a device for converting X-rays invisible to the naked eye into electrical signals. In existing X-ray detectors, the detection accuracy of the X-ray detector may be reduced when the photosensitive layer is increased.

SUMMARY

The embodiments of the present disclosure provide an X-ray detector and a method for manufacturing the same. The technical solution is as follows.

According to a first aspect of the present disclosure, there is provided an X-ray detector, the X-ray detector including: a base substrate; a plurality of detection modules disposed on the base substrate, wherein the detection module includes a thin film transistor disposed on the base substrate, an insulating layer with a via hole disposed on the thin film transistor and a photosensitive structure disposed on the insulating layer, a first electrode of the thin film transistor is electrically connected to the photosensitive structure through the via hole on the insulating layer, and the first electrode is a source or a drain electrode of the thin film transistor; and a scintillation layer disposed on the detection module.

In one embodiment, the photosensitive structure includes a photosensitive layer, a driving electrode, and a sensing electrode, and the sensing electrode is electrically connected to the first electrode through the via hole on the insulating layer, the driving electrodes are configured to apply a voltage to the photosensitive layer, and the sensing electrode is configured to receive a current output from the photosensitive layer.

In one embodiment, the photosensitive layer includes a lightly doped amorphous silicon photosensitive layer.

In one embodiment, the lightly doped amorphous silicon photosensitive layer is a boron lightly doped amorphous silicon photosensitive layer, and the lightly doped amorphous silicon photosensitive layer has $5 \times 10^{11}$ to $1 \times 10^{13}$ boron atoms per square centimeter.

In one embodiment, the photosensitive structure further includes an organic-inorganic composite dielectric thin film, the organic-inorganic composite dielectric thin film is disposed between the driving electrode and the photosensitive layer; and the organic-inorganic composite dielectric thin film is further provided between the sensing electrode and the photosensitive layer.

In one embodiment, the organic-inorganic composite dielectric thin film has a thickness of 100 nanometers to 300 nanometers.

In one embodiment, an orthographic projection of the photosensitive structure on the base substrate and an orthographic projection of the thin film transistor on the base substrate have an overlapping area.

In one embodiment, the photosensitive layer in the plurality of detection modules has an integrated structure.

In one embodiment, the organic-inorganic composite dielectric thin film in the plurality of detection modules is an integral structure.

According to a second aspect of the present disclosure, there is provided an X-ray detector, the X-ray detector including: forming a plurality of detection modules on a base substrate, wherein the detection module includes a thin film transistor disposed on the base substrate, an insulating layer with a via hole disposed on the thin film transistor and a photosensitive structure disposed on the insulating layer, a first electrode of the thin film transistor is electrically connected to the photosensitive structure through the via hole on the insulating layer, and the first electrode is a source or a drain electrode of the thin film transistor; and forming a scintillation layer on the detection module.

In one embodiment, forming a plurality of detection modules on a base substrate includes: forming the thin film transistor on the base substrate; forming the insulating layer including a via hole on the base substrate formed with the thin film transistor; and forming the photosensitive structure on the base substrate formed with the insulating layer including the via hole.

In one embodiment, forming the photosensitive structure on the base substrate formed with the insulating layer including the via hole includes: forming a driving electrode and a sensing electrode on the base substrate formed with the insulating layer including the via hole, wherein the sensing electrode is electrically connected to the first electrode through the via hole on the insulating layer; and forming a photosensitive layer on the base substrate formed with the driving electrode and the sensing electrode.

In one embodiment, before forming a photosensitive layer on the base substrate formed with the driving electrode and the sensing electrode, the method further includes: forming an organic-inorganic composite dielectric thin film on the base substrate formed with the driving electrode and the sensing electrode; and forming a photosensitive layer on the base substrate formed with the driving electrode and the sensing electrode includes: forming the photosensitive layer on the base substrate formed with the organic-inorganic composite dielectric thin film.

In one embodiment, forming a photosensitive layer on the base substrate formed with the driving electrode and the sensing electrode includes: forming an amorphous silicon thin film on the base substrate formed with the driving electrode and the sensing electrode; performing boron ion implantation on the amorphous silicon thin film; and performing a low temperature annealing process on the amorphous silicon thin film after the boron ion implantation, to transform the amorphous silicon thin film into the photosensitive layer.

In one embodiment, the temperature of the low temperature annealing process is 150 degrees Celsius to 230 degrees Celsius and the time is 1 hour to 2 hours.

BRIEF DESCRIPTION OF THE DRAWINGS

In order to more clearly explain the technical solutions in the embodiments of the present disclosure, the drawings needed to be used in the description of the embodiments will be briefly described below. Apparently, the drawings in the following description are merely some embodiments of the present disclosure. For those of ordinary skill in the art, other drawings may also be obtained based on these drawings without any creative work.

FIG. 3-1 is a schematic structural diagram of another X-ray detector shown in an embodiment of the present disclosure;

FIG. 3-2 is a graph showing the relationship between the wavelength of light and the light absorption coefficient of the boron lightly doped amorphous silicon photosensitive layer in the embodiment shown in FIG. 3-1;

FIG. 5-1 is a flowchart of another method for manufacturing an X-ray detector according to an embodiment of the present disclosure; and FIG. 5-2 is a flowchart of forming a photosensitive layer in the embodiment shown in FIG. 5-1.

Through the above-described drawings, specific embodiments of the present disclosure have been shown, which will be described in more detail later. These figures and text descriptions are not intended to limit the scope of the present disclosure in any way, but the concept of the present disclosure will be explained to those skilled in the art by referring to specific embodiments.

DETAILED DESCRIPTION

To make the objectives, technical solutions, and advantages of the present disclosure clearer, the embodiments of the present disclosure will be further described in detail below with reference to the accompanying drawings.

Figure 1:
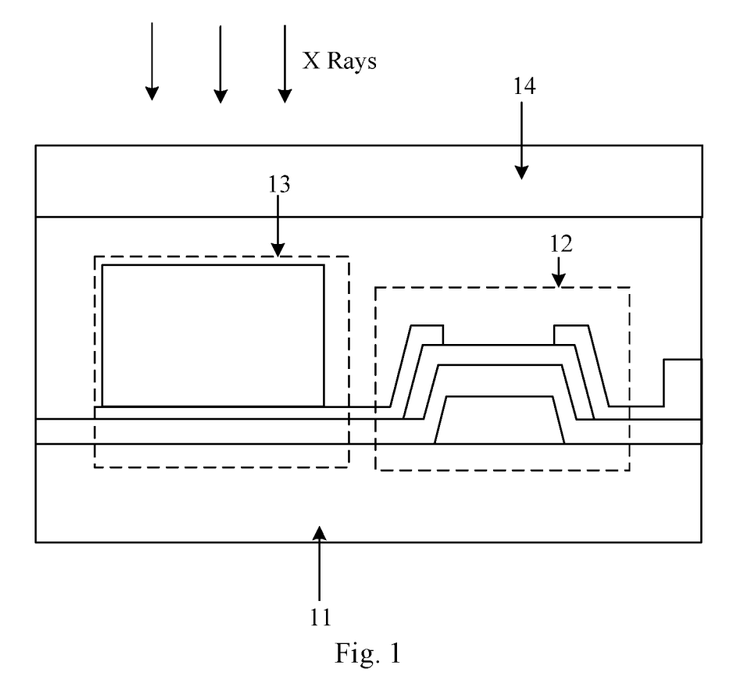
FIG. 1 is a schematic structural diagram of an X-ray detector in the related art.

As shown in FIG. 1, an X-ray detector generally includes a substrate 11, a plurality of detection modules disposed on the substrate 11, and a scintillation layer 14 disposed on the plurality of detection modules. Each of the detection modules includes a thin film transistor 12 and a photosensitive structure 13. The photosensitive structure 13 is disposed on the drain electrode of the TFT 12 and is electrically connected with the TFT 12. The scintillation layer 14 is configured to convert an X-ray to a visible light. The photosensitive structure 13 is configured to convert a visible light to an electrical signal. The TFT 12 is configured to serve as a switch for reading the electrical signal. When the X-ray detector is operating, an X-ray emitting device and an X-ray detector may be disposed on both sides of a subject to be measured (for example, a human body), and X-rays emitted by the X-ray emitting device are modulated while passing through the subject to be measured. After the modulated X-rays are irradiated on the X-ray detector, the X-ray detector can convert the modulated X-rays into electrical signals and output the electrical signals. The signal-to-noise ratio (SNR) of an X-ray detector is positively related to a photosensitive area of the photosensitive structure (the area of the side of the photosensitive structure that receives the X-rays), which increases the sensitivity of the photosensitive structure. The area can increase the signal-to-noise ratio of the X-ray detector.

During the implementation of the present disclosure, it is found that the related art has at least the following problems.

In the related art, when the photosensitive area of the photosensitive structure disposed on the drain electrode of the TFT is enlarged, the detection module is also enlarged. The enlargement of the detection module will reduce the density of the detection module in the X-ray detector, and in turn will reduce the detection accuracy of the X-ray detector.

Figure 2:
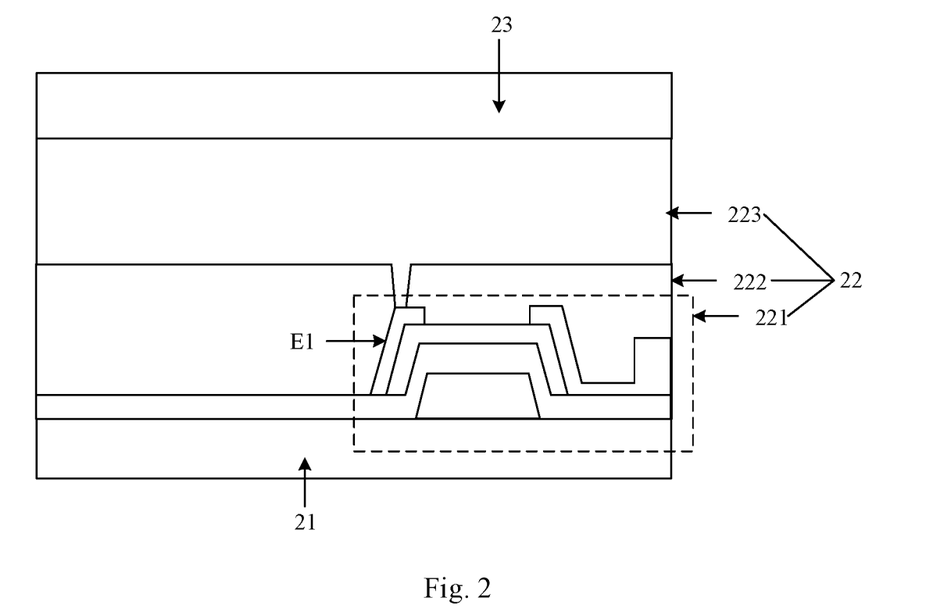
FIG. 2 is a schematic structural diagram of an X-ray detector shown in an embodiment of the present disclosure.

FIG. 2 is a schematic structural diagram of an X-ray detector shown in an embodiment of the present disclosure. The X-ray detector may include a base substrate 21. A plurality of detection modules 22 is disposed on the base substrate 21. Any one of the detection modules 22 includes a TFT 221, an insulating layer 222 provided with a via hole (not shown in FIG. 2) and a photosensitive structure 223 disposed in sequence. A first electrode E1 in the TFT 221 is electrically connected to the photosensitive structure 223 through the via hole on the insulating layer 222. The first electrode E1 is the source electrode or the drain electrode of the TFT 221.

A scintillation layer 23 is disposed on the base substrate 21 provided with the plurality of detection modules 22, and the scintillation layer 23 is disposed on the detection modules 22.

Accordingly, in the X-ray detector provided by the embodiment of the present disclosure, by disposing the photosensitive structure and the TFT in different layers, the photosensitive area of the photosensitive structure is enlarged, and it will not be affected by the TFT. It can solve the problem that, in the related art, enlargement of the detection module will reduce the detection accuracy of the X-ray detector. It can achieve the effect of enlarging the photosensitive area of photosensitive structure without reducing the detection accuracy of the X-ray detector.

Figure 31:
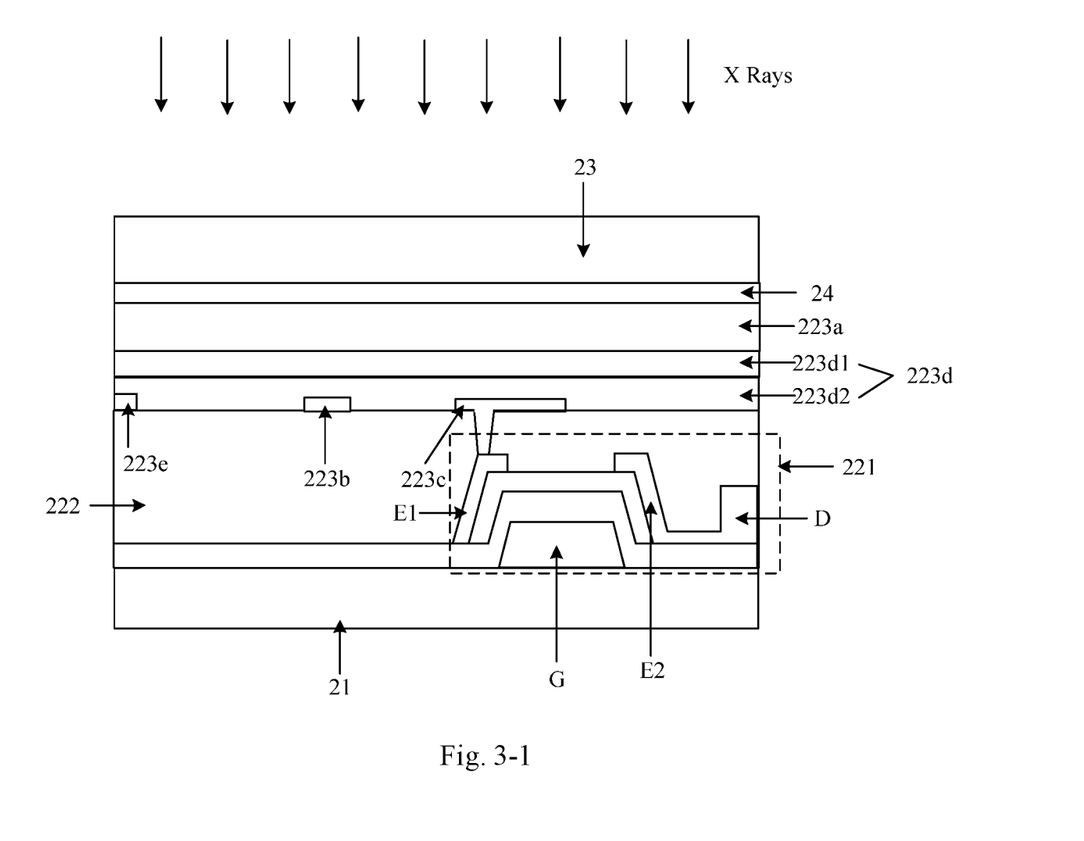

Further, referring to FIG. 3-1, FIG. 3-1 is a schematic structural diagram of another X-ray detector shown in an embodiment of the present disclosure. The X-ray detector is provided with more preferred components on the basis of the X-ray detector shown in FIG. 2, such that the X-ray detector provided by the disclosed embodiment has better performance.

In one embodiment, the photosensitive structure includes a photosensitive layer 223a, a driving electrode 223b and a sensing electrode 223c. The sensing electrode 223c passes through a via hole (not shown in FIG. 3-1) on the insulating layer 222 and the first electrode E1. The driving electrode 223b is configured to apply a voltage to the photosensitive layer 223a. Photo-carriers (generated by the light emitted from the scintillation layer) in the photosensitive layer 223a are ionized, and movement of electrons forms a current received by the sensing electrode 223c. The sensing electrode 223c is configured to receive the current output by the photosensitive layer 223a.

The material of the driving electrodes 223b and the sensing electrodes 223c may include molybdenum (Mo), aluminum, silver nanowires, graphene, and the like. The driving electrode 223b and the sensing electrode 223c may be manufactured by a magnetron sputtering method or a solution method, and the thickness of the driving electrode 223b and the sensing electrode 223c may be 30 nm (nanometers) to 200 nm.

In one embodiment, the photosensitive layer 223a includes a lightly doped amorphous silicon photosensitive layer.

Figure 32:
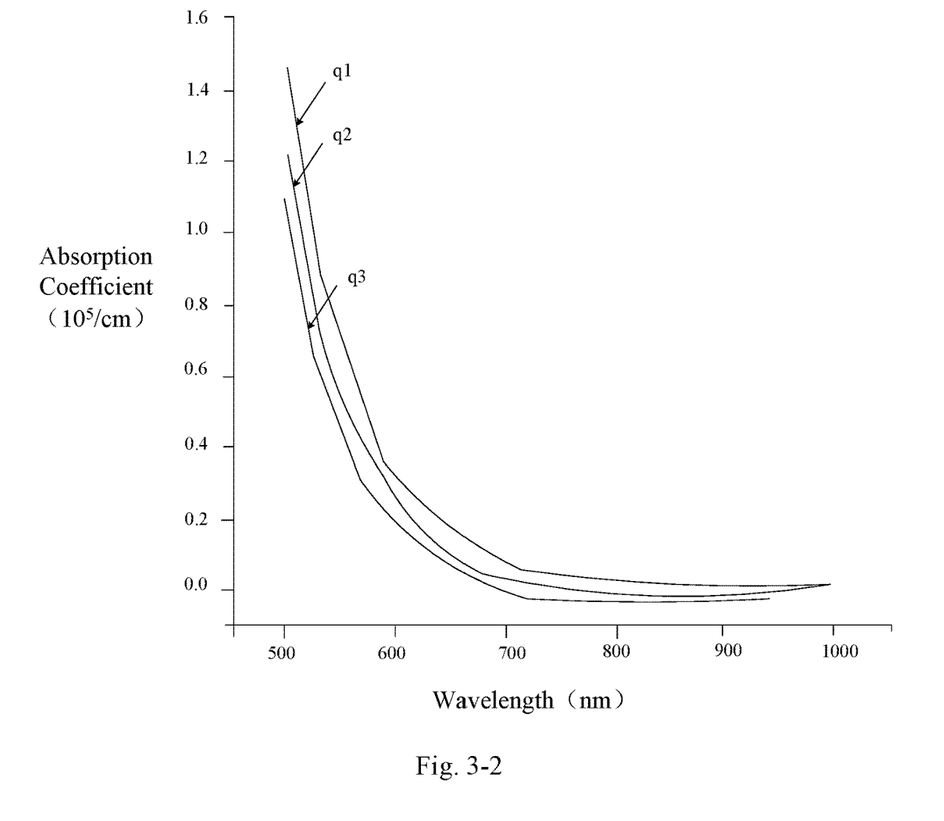

In one embodiment, the lightly doped amorphous silicon photosensitive layer 223a is a boron lightly doped amorphous silicon photosensitive layer. The lightly doped amorphous silicon photosensitive layer 223a has $5\times10^{11}$ to $1\times10^{13}$ boron atoms per square centimeter. The higher the light absorption coefficient of the boron lightly doped amorphous silicon photosensitive layer is, the higher the light absorption coefficient is, and the higher the performance of the photosensitive layer is. As shown in FIG. 3-2, FIG. 3-2 is a graph showing the relationship between the wavelength of light and the light absorption coefficient of the boron lightly doped amorphous silicon photosensitive layer in the embodiment shown in FIG. 3-1. The horizontal axis represents the wavelength of light in nanometers, and the vertical axis represents the light absorption coefficient in a unit of $10^5$ per centimeter ($10^5$/cm). The curve q1 represents the curve when the boron doping rate is 0.8%, and the curve q2 represents the boron doping when the rate is 0.6%, and the curve q3 represents the curve when the boron doping rate is 0.4%. It can be seen that as the boron doping rate increases, the light absorption coefficient also increases. This is because the boron atoms fill the dangling bonds in the amorphous silicon photosensitive layer, such that a stable silicon-boron bond is formed in the amorphous silicon photosensitive layer which reduces the defect states and dangling bonds in the amorphous silicon thin film, and enhances the non-amorphous the ability of absorbing photons and generating photoelectron of the amorphous silicon thin film. It can ensure that the photocurrent of the photosensitive structure is increased while employing a thin amorphous silicon thin film as a photosensitive layer, which can effectively increase the detection quantum efficiency and image quality of the detector.

In one embodiment, the photosensitive structure further includes an organic-inorganic composite film 223d. The organic-inorganic composite film 223d is disposed between the driving electrode 223b and the photosensitive layer 223a. The organic-inorganic composite film 223d is also disposed between the sensing electrode 223c and the photosensitive layer 223a. The organic-inorganic composite dielectric thin film 223d may include an inorganic dielectric thin film 223d1 and an organic dielectric thin film 223d2. The material of the inorganic dielectric thin film 223d1 may include $SiO_2$ (silicon dioxide) or SiNx (silicon nitride). The material of the organic dielectric thin film 223d2 may include a polyimide (PI).

Photocurrent and dark current are parameters of a photosensitive device (such as a photosensitive layer). When lights irritate the photosensitive device, the current passing through the photosensitive device is called a photocurrent. When there is no light, the current passing through the photosensitive device under applied voltage is called dark current. The higher the ratio of the photocurrent to the dark current is, the higher the photoelectric conversion efficiency of the photosensitive device is, and the higher the signal to noise ratio of the X-ray detector made of the photosensitive device will be. The provision of an organic-inorganic composite dielectric thin film in the photosensitive structure can reduce the dark current to increase the ratio of the photocurrent to the dark current.

In one embodiment, the organic-inorganic composite dielectric thin film 223d has a thickness of 100 nanometers to 300 nanometers.

In one embodiment, an orthographic projection of the photosensitive structure on the base substrate 21 (the size of the orthogonal projection may be determined by the photosensitive layer 223a in the photosensitive structure) and an orthogonal projection of the TFT 221 on the base substrate 21 have an overlapping area. That is, the photosensitive structure and the TFT are overlapped such that the photosensitive structure can cover the entire upper surface of the detection module (the upper surface can be a side receiving X-ray irradiation), which greatly improves the photosensitive area of the photosensitive structure.

In one embodiment, the photosensitive layers 223a in the plurality of detection modules 22 have an integral structure. That is, the photosensitive layers 223a in the plurality of detection modules 22 in the X-ray detector may be a whole film layer, which can simplify the forming process of the photosensitive layer.

In one embodiment, the organic-inorganic composite dielectric thin films 223d in the plurality of detection modules 22 are of an integral structure. That is, the organic-inorganic composite dielectric thin films 223d in the plurality of detection modules 22 in the X-ray detector may be connected together as a whole film. This can simplify the forming process of the photosensitive layer.

In one embodiment, the photosensitive structure may further include a metal wire 223e. The metal wire 223e may be a wiring of the driving electrode 223b and other electrodes for connecting to an external power source. The external power source may apply a voltage to the driving electrode. 223b through the metal wire 223e. The metal wire 223e may be further provided with a metal wire protective layer there on, for preventing oxidation of the metal wire 223e. The metal wire protective layer may be made of indium tin oxide (ITO).

In one embodiment, the material of the scintillator layer 23 may include cesium iodide, which is a light-sensitive material. The scintillating layer 23 may include a pillar-shaped array of crystals and may have a thickness of 400 micrometers to 1000 micrometers.

In one embodiment, a passivation layer (PVX) 24 may also be disposed between the scintillator layer 23 and the photosensitive layer 223a. The passivation layer 24 may protect the photosensitive layer 223a.

In one embodiment, the TFT 221 further includes a gate electrode G and a second electrode E2. Through the gate electrode G, the TFT 221 can be controlled to be turned on or off. The second electrode E2 may be connected to a data line D, and the data line D may be connected to an external receiving module. The receiving module is configured to receive the converted charge of the X-ray detector. The amount of charges output from the TFT at a certain position is directly proportional to the dose of X-rays at the position. Therefore, dose of X-rays at different positions can be known, thus a digital image of the X-rays can be obtained. The process of obtaining the digital image of the X-rays may refer to related technologies and will not be repeated herein.

In one embodiment, the TFT 221 may be an amorphous silicon TFT, a low-temperature polysilicon TFT, or the like.

In one embodiment, the base substrate 21 may be a glass substrate, a silicon wafer, a polyimide plastic substrate, or the like.

Accordingly, in the X-ray detector provided by the embodiment of the present disclosure, by disposing the photosensitive structure and the TFT in different layers, the photosensitive area of the photosensitive structure is enlarged, and it will not be affected by the TFT. It can solve the problem that in the related art, enlargement of the detection module will reduce the detection accuracy of the X-ray detector. It can achieve the effect of enlarging the photosensitive area of photosensitive structure without reducing the detection accuracy of the X-ray detector.

Figure 4:
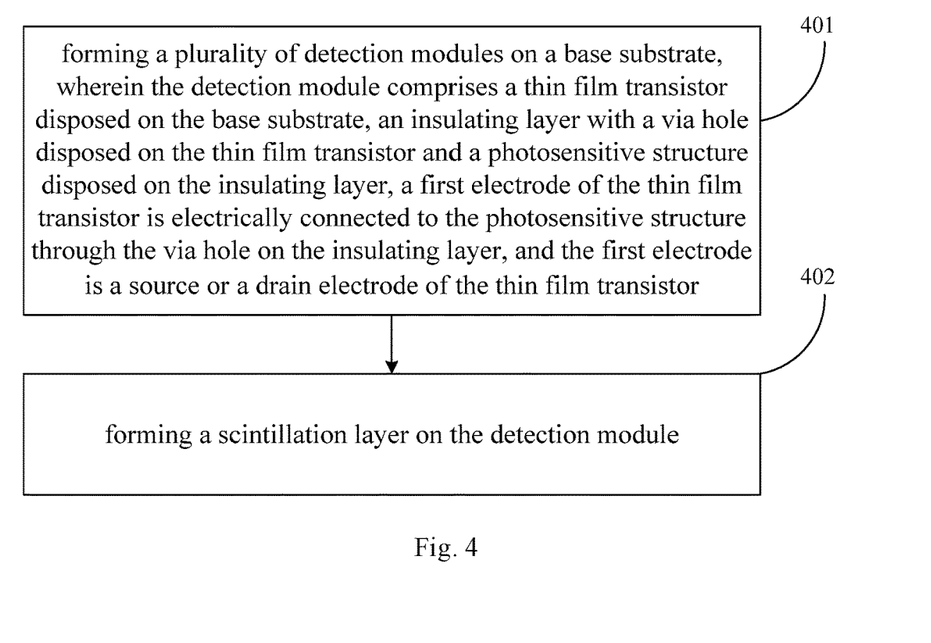
FIG. 4 is a flowchart of a method for manufacturing an X-ray detector according to an embodiment of the present disclosure.

FIG. 4 is a flowchart of a method for manufacturing an X-ray detector according to an embodiment of the present disclosure. The method may be applied for manufacturing the X-ray detector as shown in FIG. 2. The method includes the following steps.

In step 401, a plurality of detection modules are formed on a base substrate. Any one of the detection modules 22 includes a thin film transistor TFT, an insulating layer including a via hole and a photosensitive structure disposed in sequence. A first electrode in the TFT is electrically connected to the photosensitive structure through the via hole on the insulating layer. The first electrode is the source electrode or the drain electrode of the TFT.

In step 402, a scintillation layer is formed on the base substrate provided with the plurality of detection modules.

Accordingly, in the method for manufacturing an X-ray detector provided by the embodiment of the present disclosure, by disposing the photosensitive structure and the TFT in different layers, the photosensitive area of the photosensitive structure is enlarged, and it will not be affected by the TFT. It can solve the problem that in the related art, enlargement of the detection module will reduce the detection accuracy of the X-ray detector. It can achieve the effect of enlarging the photosensitive area of photosensitive structure without reducing the detection accuracy of the X-ray detector.

Figure 51:
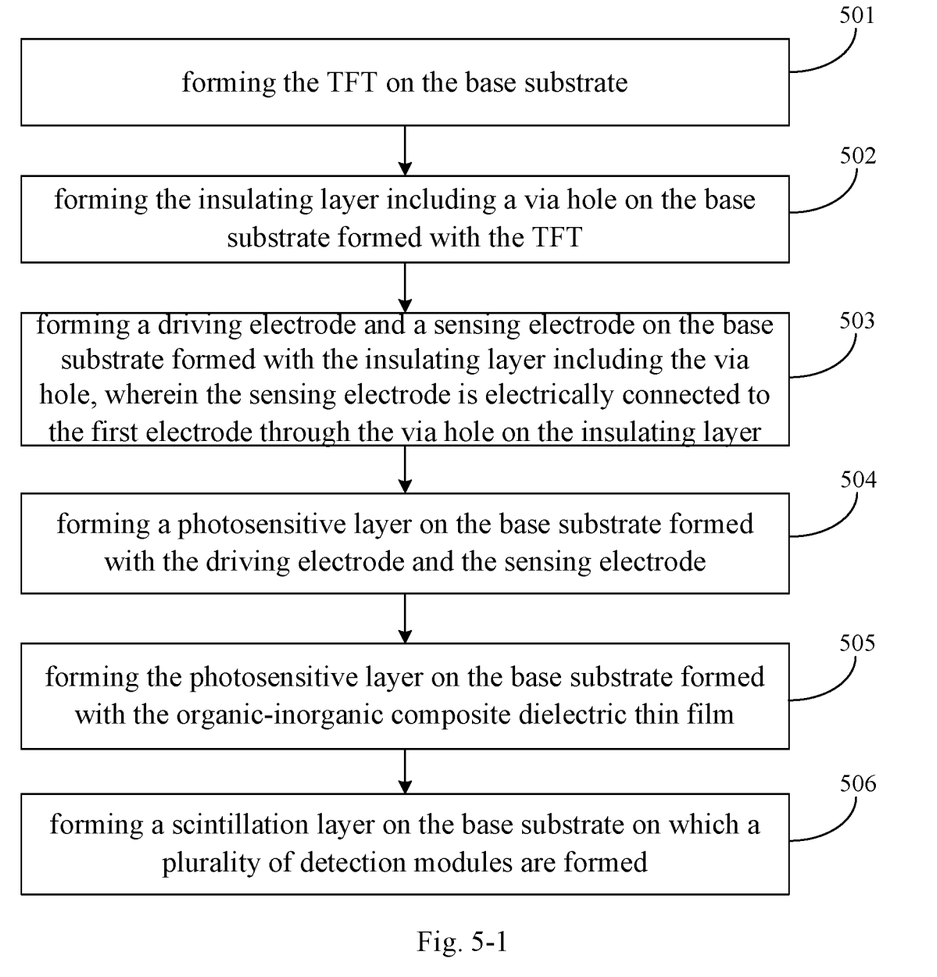

FIG. 5-1 is a flowchart of another method for manufacturing an X-ray detector according to an embodiment of the present disclosure. The method may be applied for manufacturing the X-ray detector as shown in FIG. 3-1. The method includes the following steps.

In step 501, a TFT is formed on a base substrate.

First, a TFT may be formed on a base substrate. The TFT may be a TFT array. One TFT may be formed for each detection module. The TFT on the base substrate may include at least one of an amorphous silicon TFT and a low-temperature polysilicon TFT. The TFT may include a first electrode, a second electrode, and a gate electrode.

In step 502, an insulating layer including a via hole is formed on the base substrate on which the TFT is formed.

An insulating layer including a via hole may be formed by a patterning process on the base substrate on which the TFT is formed. The via hole functions to make the electrodes under the insulating layer to be in contact with the photosensitive structures over the insulating layer.

In step 503, a driving electrode and a sensing electrode are formed on the base substrate formed with the insulating layer including the via hole. The sensing electrode is electrically connected to the first electrode through the via hole on the insulating layer.

The driving electrode and the sensing electrode may be formed on a base substrate on which an insulating layer including a via hole is formed by a magnetron sputtering method or a solution method, and the sensing electrode is electrically connected to the first electrode through the via hole on the insulating layer.

In step 504, an organic-inorganic composite dielectric thin film is formed on the base substrate on which the driving electrode and the sensing electrode are formed.

After the driving electrode and the sensing electrode are formed, an organic-inorganic composite dielectric thin film may be formed on the base substrate on which the driving electrode and the sensing electrode are formed. The organic-inorganic composite dielectric thin film may have a thickness of 100 nanometers to 300 nanometers for reducing the dark current of the photosensitive structure.

The organic-inorganic composite dielectric thin film may include an inorganic dielectric thin film and an organic dielectric thin film. The material of the inorganic dielectric thin film may include $SiO_2$ or $SiNx$, and the material of the organic dielectric thin film may include polyimide.

The organic-inorganic composite dielectric thin film in the plurality of detection modules may be an integrated structure, which may be formed in one process in step 504.

In step 505, a photosensitive layer is formed on the base substrate formed with an organic-inorganic composite dielectric thin film.

Figure 52:
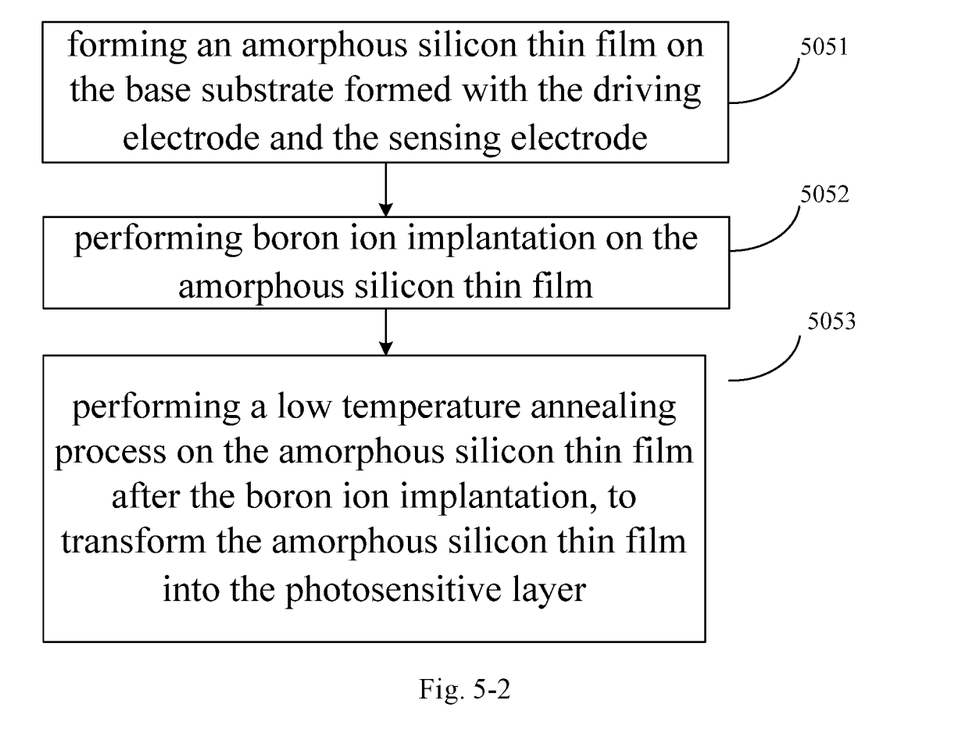

As shown in FIG. 5-2, this step can include the following three sub-steps.

In sub-step 5051, an amorphous silicon thin film is formed on the base substrate on which the driving electrode and the sensing electrode are formed.

In forming the photosensitive layer, first, an amorphous silicon thin film may be formed on the base substrate on which the driving electrode and the sensing electrode are formed.

In sub-step 5052, boron ion implantation is performed on the amorphous silicon thin film.

After the amorphous silicon thin film is formed, boron ions may be implanted into the amorphous silicon thin film, and an acceleration voltage may be 20 kV (kilovolts) to 50 kV when implanted. After the implantation is completed, the number of boron atoms per square centimeter in the amorphous silicon thin film may be $5 \times 10^{11}$ to $1 \times 10^{13}$ boron atoms.

In sub-step 5053, the amorphous silicon thin film has subjected to boron ion implantation is subjected to a low temperature annealing process to transform the amorphous silicon thin film into a photosensitive layer.

After the boron ion implantation, the amorphous silicon thin film can be annealed at a low temperature to transform the amorphous silicon thin film into a photosensitive layer. The temperature of the low-temperature annealing is 150 degrees Celsius to 230 degrees Celsius and the time is 1 hour to 2 hours.

The photosensitive layer in the plurality of detection modules may be a whole film layer, and the whole film layer may be formed in one process through sub-step 5051 to sub-step 5052.

A plurality of detection modules arranged in an array may be formed on the base substrate through steps 503 to 505.

In step 506, a scintillation layer is formed on the base substrate on which a plurality of detection modules are formed.

After a plurality of detection modules are formed on the base substrate through steps 503 to 505, a scintillation layer may be formed on the base substrate on which the plurality of detection modules are formed. The scintillation layer can be a pillar-shaped array of crystals. The material may include iridium iodide and may have a thickness of 400 microns to 1000 microns.

In one embodiment, a passivation layer for protecting the photosensitive layer and a metal wire protective layer for protecting the electrode wiring in the X-ray detector may be formed before forming the layer.

Accordingly, in the method for manufacturing an X-ray detector provided by the embodiment of the present disclosure, by disposing the photosensitive structure and the TFT in different layers, the photosensitive area of the photosensitive structure is enlarged, and it will not be affected by the TFT. It can solve the problem that in the related art, enlargement of the detection module will reduce the detection accuracy of the X-ray detector. It can achieve the effect of enlarging the photosensitive area of photosensitive structure without reducing the detection accuracy of the X-ray detector.

The term "at least one of A and B" in the present disclosure is merely describing an association of associated objects, which may include three situations. For example, at least one of A and B may indicate only A, both A and B, or only B. Similarly, "at least one of A, B and C" means that there can be seven situations, respectively: only A, only B, only C, both A and B, both A and C, both B and C, or all A, B and C. Similarly, "at least one of A, B, C and D" means that there can be fifteen situations, respectively: only A, only B, only C, only D, both A and B, both A and C, both A and D, both C and B, both D and B, both C and D, A, B and C, A, B and D, A, C and D, B, C and D, and all A, B, C and D.

Those of ordinary skill in the art may understand that all or part of the steps for implementing the above embodiments may be completed by hardware, or may be instructed by a program to perform the relevant hardware, and the program may be stored in a computer-readable storage medium. The storage medium mentioned may be a read-only memory, a magnetic disk or an optical disk.

The foregoing descriptions are merely preferred embodiments of the present disclosure and are not intended to limit the present disclosure. Any modification, equivalent replacement, or improvement made within the spirit and principle of the present disclosure shall be included in the protection scope of the present disclosure.

What is claimed is:

1. An X-ray detector comprising:
a base substrate;
a plurality of detection modules disposed on the base substrate, and
a scintillation layer disposed on the detection module, wherein the detection module comprises:
a thin film transistor disposed on the base substrate,
an insulating layer having a via hole and disposed on the thin film transistor, and
a photosensitive structure disposed on the insulating layer,
wherein the photosensitive structure comprises a photosensitive layer, a driving electrode, and a sensing electrode, and the sensing electrode is electrically connected to a first electrode of the thin film transistor through the via hole on the insulating layer, the driving electrode is configured to apply a voltage to the photosensitive layer, and the sensing electrode is configured to receive a current output from the photosensitive layer;
the photosensitive structure further comprises an organic-inorganic composite dielectric thin film, the organic-inorganic composite dielectric thin film is disposed between the driving electrode and the photosensitive layer; the organic-inorganic composite dielectric thin film is further provided between the sensing electrode and the photosensitive layer; and the organic-inorganic composite dielectric thin film comprises a laminated structure of an inorganic dielectric thin film and an organic dielectric thin film;
the first electrode of the thin film transistor is electrically connected to the photosensitive structure through the via hole on the insulating layer, and the first electrode is a source or a drain electrode of the thin film transistor.

2. The X-ray detector according to claim 1, wherein the photosensitive layer comprises a lightly doped amorphous silicon photosensitive layer.

3. The X-ray detector according to claim 2, wherein an orthographic projection of the photosensitive structure on the base substrate and an orthographic projection of the thin film transistor on the base substrate have an overlapping area.

4. The X-ray detector according to claim 2, wherein the lightly doped amorphous silicon photosensitive layer is a boron lightly doped amorphous silicon photosensitive layer, and the lightly doped amorphous silicon photosensitive layer has $5 \times 10^{11}$ to $1 \times 10^{13}$ boron atoms per square centimeter.

5. The X-ray detector according to claim 4, wherein an orthographic projection of the photosensitive structure on the base substrate and an orthographic projection of the thin film transistor on the base substrate have an overlapping area.

6. The X-ray detector according to claim 1, wherein the organic-inorganic composite dielectric thin film has a thickness of 100 nanometers to 300 nanometers.

7. The X-ray detector according to claim 6, wherein an orthographic projection of the photosensitive structure on the base substrate and an orthographic projection of the thin film transistor on the base substrate have an overlapping area.

8. The X-ray detector according to claim 1, wherein an orthographic projection of the photosensitive structure on the base substrate and an orthographic projection of the thin film transistor on the base substrate have an overlapping area.

9. The X-ray detector according to claim 1, wherein the photosensitive layer in the plurality of detection modules has an integrated structure.

10. The X-ray detector according to claim 1, wherein the organic-inorganic composite dielectric thin film in the plurality of detection modules is an integral structure.

* * * * *